US009959910B2

(12) United States Patent
Zhang

(10) Patent No.: US 9,959,910 B2
(45) Date of Patent: *May 1, 2018

(54) OFFSET-PRINTING METHOD FOR THREE-DIMENSIONAL PRINTED MEMORY

(71) Applicant: HangZhou HaiCun Information Technology Co., Ltd., HangZhou (CN)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvallis, OR (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/371,235

(22) Filed: Dec. 7, 2016

(65) Prior Publication Data
US 2017/0084621 A1 Mar. 23, 2017

Related U.S. Application Data

(63) Continuation of application No. 14/876,908, filed on Oct. 7, 2015, now abandoned, which is a continuation
(Continued)

(30) Foreign Application Priority Data

Oct. 24, 2016 (CN) .......................... 2016 1 0925942

(51) Int. Cl.
G11C 5/02 (2006.01)
G11C 17/00 (2006.01)
(Continued)

(52) U.S. Cl.
CPC .................. *G11C 5/02* (2013.01); *G11C 8/06* (2013.01); *G11C 11/56* (2013.01); *G11C 17/00* (2013.01); *G11C 17/06* (2013.01); *G11C 17/16* (2013.01); *G11C 17/18* (2013.01); *H01L 21/8221* (2013.01); *H01L 21/8229* (2013.01); *H01L 25/0657* (2013.01); *H01L 27/1021* (2013.01); *H01L 27/1128* (2013.01); *H01L 27/11206* (2013.01); *G11C 2213/71* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73265* (2013.01); *H01L 2225/06506* (2013.01); *H01L 2225/06562* (2013.01); *H01L 2225/06582* (2013.01); *H01L 2924/181* (2013.01)

(58) Field of Classification Search
CPC ......... G11C 17/18; G11C 17/06; G11C 17/16; H01L 27/11206; H01L 27/1021
See application file for complete search history.

(56) References Cited

U.S. PATENT DOCUMENTS 4,404,655 A 9/1983 Naiff
4,424,579 A 1/1984 Roesner
(Continued)

Primary Examiner — Mohammed A Bashar

(57) ABSTRACT

The present invention discloses an offset-printing method for a three-dimensional printed memory. The mask-patterns for different memory levels are merged onto a multi-region data-mask. At different printing steps, a wafer is offset by different values with respect to the data-mask. Accordingly, data-patterns from a same data-mask are printed into different memory levels.

14 Claims, 16 Drawing Sheets

Related U.S. Application Data of application No. 13/599,085, filed on Aug. 30, 2012, now Pat. No. 9,190,412.

(60) Provisional application No. 61/529,920, filed on Sep. 1, 2011.

(51) Int. Cl.

| | |
|---|---|
| *H01L 27/102* | (2006.01) |
| *G11C 17/16* | (2006.01) |
| *H01L 27/112* | (2006.01) |
| *G11C 17/06* | (2006.01) |
| *G11C 17/18* | (2006.01) |
| *H01L 21/822* | (2006.01) |
| *H01L 21/8229* | (2006.01) |
| *G11C 11/56* | (2006.01) |
| *G11C 8/06* | (2006.01) |
| *H01L 25/065* | (2006.01) |

(56) References Cited

U.S. PATENT DOCUMENTS

| | | |
|---|---|---|
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,385,074 B1 | 5/2002 | Johnson et al. |
| 6,515,888 B2 | 2/2003 | Johnson et al. |
| 6,624,485 B2 | 9/2003 | Johnson |
| 6,794,253 B2 | 9/2004 | Lin et al. |
| 7,952,904 B2 | 5/2011 | Zhang | m(1)

| | db '0' | cb '0' | bb '1' | ab '1' |
|---|---|---|---|---|
| | da '0' | ca '1' | ba '0' | aa '0' |

Fig. 7A m(2)

| | db '0' | cb '0' | bb '1' | ab '0' |
|---|---|---|---|---|
| | da '1' | ca '0' | ba '0' | aa '1' |

Fig. 7B $p_{18a}[1]$ (=m(1)) → 18a

|  | 2d | 2c | 2b | 2a |
|---|---|---|---|---|
| 2a | 5db '0' | 5cb '0' | 5bb '1' | 5ab '1' |
| 1a | 5da '0' | 5ca '1' | 5ba '0' | 5aa '0' |

Fig. 9A $p_{18a}[2]$ =(m(2)) → 18a

|  | 2'd | 2'c | 2'b | 2'a |
|---|---|---|---|---|
| 2'a | 5'db '0' | 5'cb '0' | 5'bb '1' | 5'ab '0' |
| 1'a | 5'da '1' | 5'ca '0' | 5'ba '0' | 5'aa '1' |

Fig. 9B $p_{18c}[1,1]\ (=\text{-}m(1))$ 18c

| | 2d | 2c | 2b | 2a |
|---|---|---|---|---|
| 2a | 5db '1' | 5cb '1' | 5bb '0' | 5ab '0' |
| 1a | 5da '1' | 5ca '0' | 5ba '1' | 5aa '1' |

Fig. 11A $p_{18c}[1,2]\ (=m(2))$ 18c

| | 2d | 2c | 2b | 2a |
|---|---|---|---|---|
| 2a | 5db '0' | 5cb '0' | 5bb '1' | 5ab '0' |
| 1a | 5da '1' | 5ca '0' | 5ba '0' | 5aa '1' |

Fig. 11B

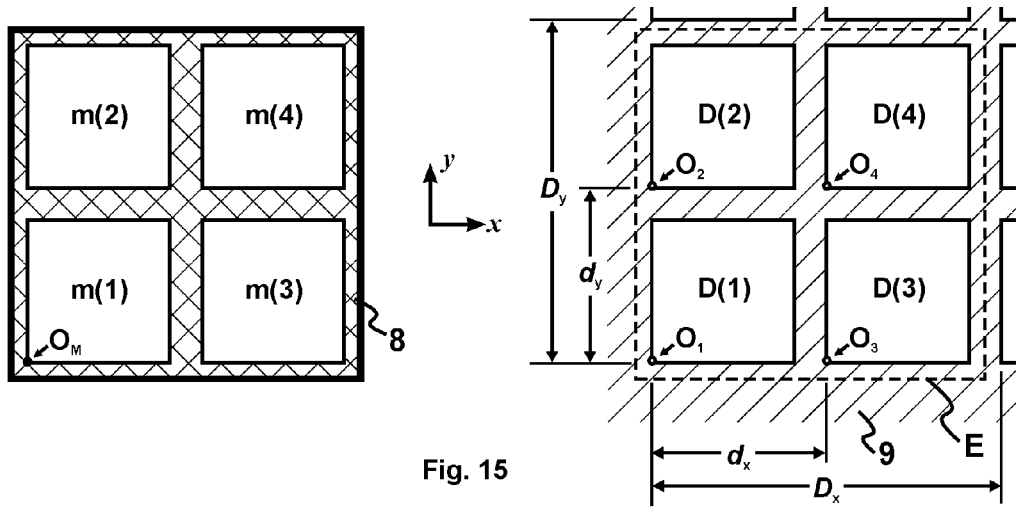
Fig. 15
| Printing Step | Data-Pattern | $O_M \rightarrow$ | D(1) | D(2) | D(3) | D(4) |
|---|---|---|---|---|---|---|
| 1 | p[1,1] | $O_1$ | m(1) | m(2) | m(3) | m(4) |
| 2 | p[1,2] | $O_2$ | m(2) | m(1) | m(4) | m(3) |
| 3 | p[2,1] | $O_3$ | m(3) | m(4) | m(1) | m(2) |
| 4 | p[2,2] | $O_4$ | m(4) | m(3) | m(2) | m(1) |
Fig. 16
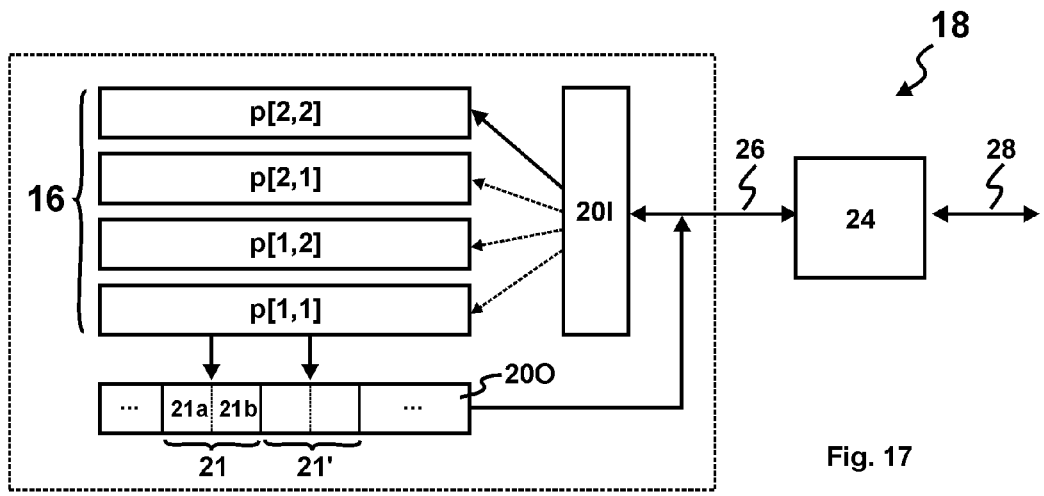
Fig. 17

| Printing Step | Data-Pattern | $O_M \rightarrow$ | D(1) | D(2) | D(3) | D(4) | D(5) | D(6) | D(7) | D(8) | D(9) |
|---|---|---|---|---|---|---|---|---|---|---|---|
| 1 | p[1] | $O_1$ | m(1) | m(2) | m(3) | m(4) | m(5) | m(6) | m(7) | m(8) | m(9) |
| 2 | p[2] | $O_2$ | m(3) | m(1) | m(2) | m(6) | m(4) | m(5) | m(9) | m(7) | m(8) |
| 3 | p[3] | $O_3$ | m(2) | m(3) | m(1) | m(5) | m(6) | m(4) | m(8) | m(9) | m(7) |

|  | M[1] | M[2] | M[3] |
|---|---|---|---|
| $C_1$ | D(1) | D(2) | D(3) |
| $C_2$ | D(4) | D(5) | D(6) |
| $C_3$ | D(7) | D(8) | D(9) |

OFFSET-PRINTING METHOD FOR THREE-DIMENSIONAL PRINTED MEMORY

CROSS-REFERENCE TO RELATED APPLICATIONS

This application is a continuation of application "Three-Dimensional Offset-Printed Memory", application Ser. No. 14/876,908, filed Oct. 7, 2015, which is a continuation of application "Three-Dimensional Offset-Printed Memory", application Ser. No. 13/599,085, filed Aug. 30, 2012, which relates to a provisional application, "Three-Dimensional Offset-Printed Memory", Application Ser. No. 61/529,920, filed Sep. 1, 2011.

BACKGROUND

1. Technical Field of the Invention

The present invention relates to the field of integrated circuit, and more particularly to mask-programmed read-only memory (mask-ROM).

2. Prior Arts

Three-dimensional mask-programmed read-only memory (3D-MPROM) has the potential to replace DVD and Blu-Ray Discs. It is ideal for mass publication. U.S. Pat. No. 5,835,396 discloses a 3D-MPROM. It is a monolithic semiconductor memory. As illustrated in FIG. 1, a typical 3D-MPROM comprises a semiconductor substrate 0 and a 3-D stack 10 stacked above. The 3-D stack 10 comprises M(M≥2) vertically stacked memory levels (e.g. 10A, 108). Each memory level (e.g. 10A) comprises a plurality of upper address lines (e.g. 2a), lower address lines (e.g. 1a) and memory cells (e.g. 5aa). Each memory cell stores n (n≥1) bits. Memory levels (e.g. 10A, 10B) are coupled to the substrate 0 through contact vias (e.g. 1av, 1av'). The substrate circuit 0X in the substrate 0 comprises a peripheral circuit for the 3-D stack 10. Hereinafter, xMxn 3D-MPROM denotes a 3D-MPROM comprising M memory levels with n bits-per-cell (bpc).

3D-MPROM is a diode-based cross-point memory. Each memory cell (e.g. 5aa) typically comprises a diode 3d. The diode 3d can be broadly interpreted as any device whose electrical resistance at the read voltage is lower than that when the applied voltage has a magnitude smaller than or polarity opposite to that of the read voltage. Each memory level (e.g. 10A) further comprises at least a data-coding layer (e.g. 6A). The pattern in the data-coding layer is a data-pattern and it represents the digital data stored in the data-coding layer. In this figure, the data-coding layer 6A is a blocking dielectric 3b, which blocks the current flow between the upper and lower address lines. Absence or existence of a data-opening (e.g. 6ca) in the blocking dielectric 3b indicates the state of a memory cell (e.g. 5ca).

In prior arts, data-patterns for different memory levels are transferred from separate data-masks. Pattern-transfer is also referred to as "print", transfers a data pattern from a data-mask to a data-coding layer. Hereinafter, "mask" can be broadly interpreted as any apparatus that carries the source image of the data to be printed. FIGS. 2A-2B illustrate two prior-art data-masks 4A, 4B. Each data-mask (e.g. 4A) is comprised of an array of mask cells "aa"-"bd". The mask-pattern (clear or dark) at each mask cell determines the existence or absence of a data-opening at the corresponding memory cell. For example, the mask-opening 4ca on the data-mask 4A leads to a data-opening 6ca at cell 5ca of the memory level 10A; the mask-openings 4'aa, 4'da on the data-mask 4B lead to data-openings 6'aa, 6'da at cells 5'aa, 5'da of the memory level 10B.

To further increase storage density, 3D-MPROM can store n(n>1) bits-per-cell (bpc). U.S. patent application Ser. No. 12/785,621 discloses a large-bpc 3D-MPROM. As illustrated in FIG. 3, each memory cell (e.g. 5aa) stores two bits: Bit-1 and Bit-2. Bit-1 is physically implemented by an extra implant, while Bit-2 is physically implemented by a resistive layer 3r. Hereinafter, j-th bit-in-a-cell denotes the j-th bit stored in an n-bpc cell (nj). For example, the $1^{st}$ bit-in-a-cell in a 2-bpc cell is Bit-1; the $2^{nd}$ bit-in-a-cell in a 2-bpc cell is Bit-2.

In prior arts, the data-patterns for different bits-in-a-cell (e.g. Bit-1, Bit-2) are printed from separate data-masks. FIGS. 4A-4B illustrate two prior-art data-masks 4C, 4D. Each data-mask (e.g. 4C) is comprised of an array of mask cells "aa"-"bd". The mask-pattern (clear or dark) at each mask cell determines the existence or absence of the extra implant or the resistive layer at the corresponding memory cell. For example, the mask-opening 4xa* on the data-mask 4C leads to the extra-implanted layer 3i at cells 5ca, 5da; the mask-openings 4'ba*, 4'da* on the data-mask 4D lead to the removal of the resistive layer 3r at cells 5ba, 5da.

Prior arts generally require M×n data-masks for an xMxn 3D-MPROM, because each memory level and each bit-in-a-cell need a separate data-mask. At 22 nm node, each data-mask costs ~$250 k (hereinafter, k=1,000). Accordingly, the data-mask set of an x8x2 3D-MPROM, including 16 (=8×2) data-masks, will cost ~$4 million. This high data-mask cost will hinder widespread applications of the 3D-MPROM. To lower the data-mask cost, the present invention discloses a three-dimensional offset-printed memory (3D-oP).

OBJECTS AND ADVANTAGES

It is a principle object of the present invention to provide a 3D-MPROM with a lower data-mask cost.

It is a further object of the present invention to provide a method to reduce the total number of data-masks of the 3D-MPROM.

In accordance with these and other objects of the present invention, a three-dimensional offset-printed memory (3D-oP) is disclosed.

SUMMARY OF THE INVENTION

The present invention discloses a three-dimensional offset-printed memory (3D-oP). 3D-oP is an improved 3D-MPROM. It records data with an offset-printing means. To realize offset-printing, the mask-patterns for a plurality of memory levels and/or bits-in-a-cell are merged onto a multi-region data-mask. At different printing steps, the wafer is offset by different values with respect to the multi-region data-mask. Accordingly, data-patterns are printed into data-coding layers for different memory levels/bits-in-a-cell from the same data-mask. Offset-printing lowers the total data-mask count and therefore, lowers the total data-mask cost.

In a 3D-oP batch, all dice are printed from the same data-masks. Although different dice may have different data-array sequence, all dice have a same data-array set. Here, a data-array is an array of digital values represented by a data-coding layer at each cell location; the data-array sequence is an ordered list of all data-arrays in a 3D-oP die, e.g. from the one closet to the substrate to the one farthest from the substrate; and a data-array set is a collection of all data-arrays in a 3D-oP die.

To make the difference in the data-array sequence transparent to users, 3D-oP preferably comprises a configurable-input/output (I/O) means. It changes inputs/outputs according to the data-array sequence of the 3D-oP die. Compared with a reference 3D-oP die, if the data-array sequence for two memory levels in a 3D-oP die of interest is reversed, the programmable-I/O changes at least a portion of its input address; if the data-array sequence for two bits-in-a-cell in this 3D-oP die is reversed, the programmable-I/O changes the bit-order of at least a portion of its output.

BRIEF DESCRIPTION OF THE DRAWINGS

FIGS. 7A-7B disclose the data-arrays m(1), m(2) represented by the two data-mask regions on the multi-region data-mask;

FIGS. 9A-9B disclose two data-arrays $p_{18a}[1]$, $p_{19a}[2]$ for the two memory levels 16A, 16B of the 3D-oP die 18a;

FIGS. 11A-11B disclose two data-arrays $p_{18c}[1,1]$, $p_{18c}[1,2]$ for Bit-1, Bit-2 of the die 18c;

FIG. 15 illustrates a multi-region data-mask for the preferred x2x2 3D-oP and all dice in an exposure field;

FIG. 16 is a table listing each data-array in each die after each printing step for the preferred x2x2 3D-oP;

FIG. 17 is a circuit block diagram of the preferred x2x2 3D-oP;

Figure 1:
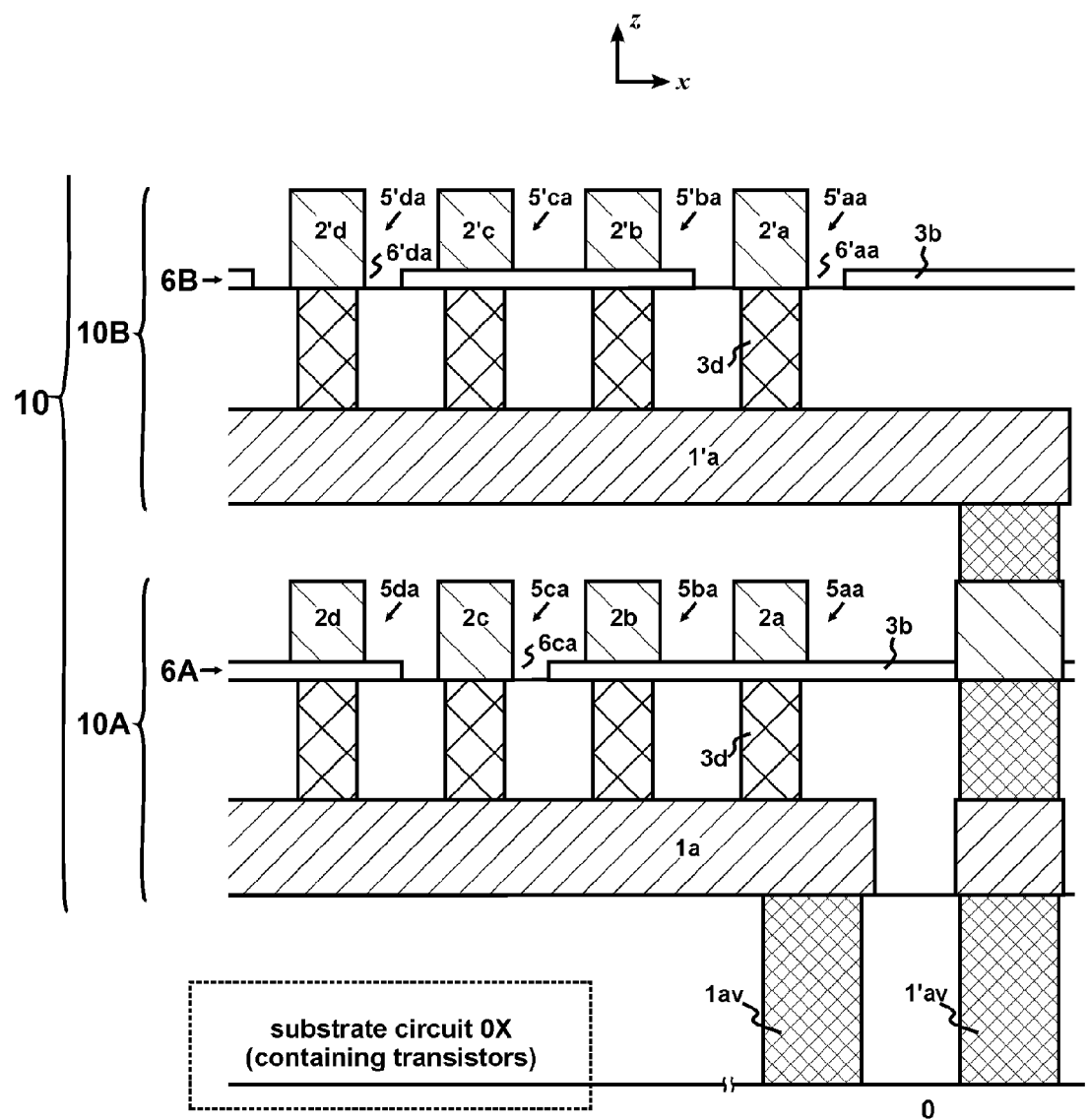
FIG. 1 is a cross-sectional view of a x2x1 3D-MPROM along the cut-line AA' of FIGS. 2A-2B.
Figure 2A:
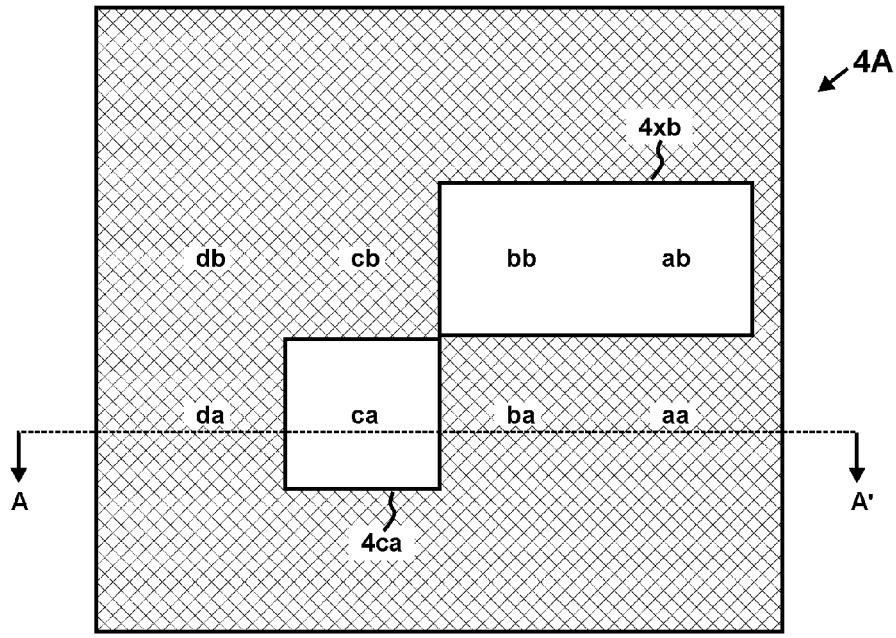
FIGS. 2A-2B disclose two data-masks for the x2x1 3D-MPROM in prior arts.
Figure 2B:
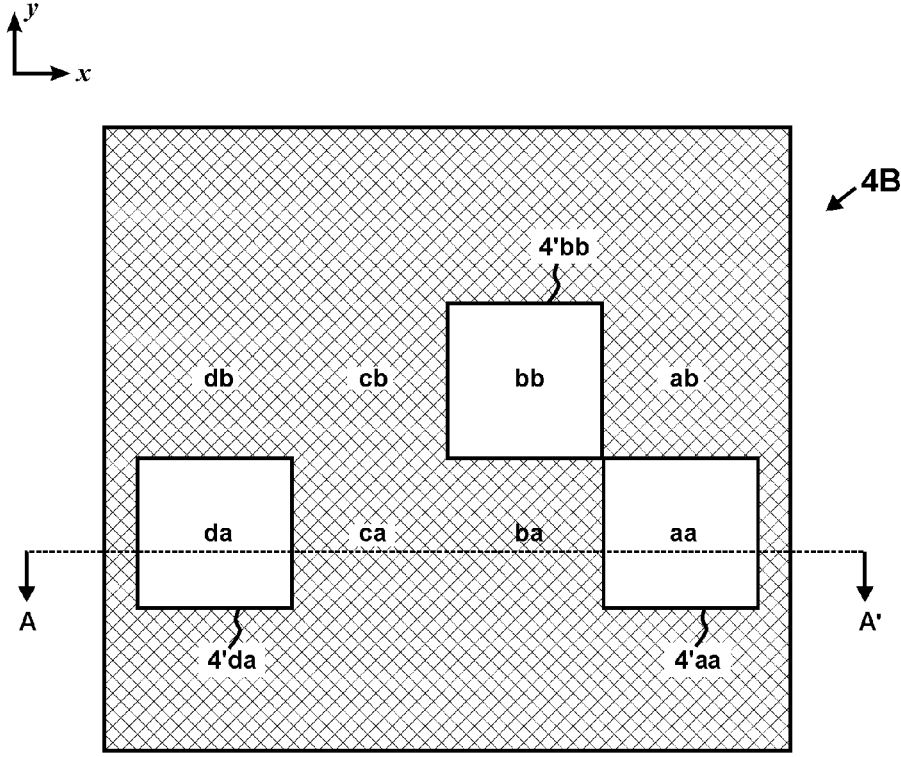
Figure 3:
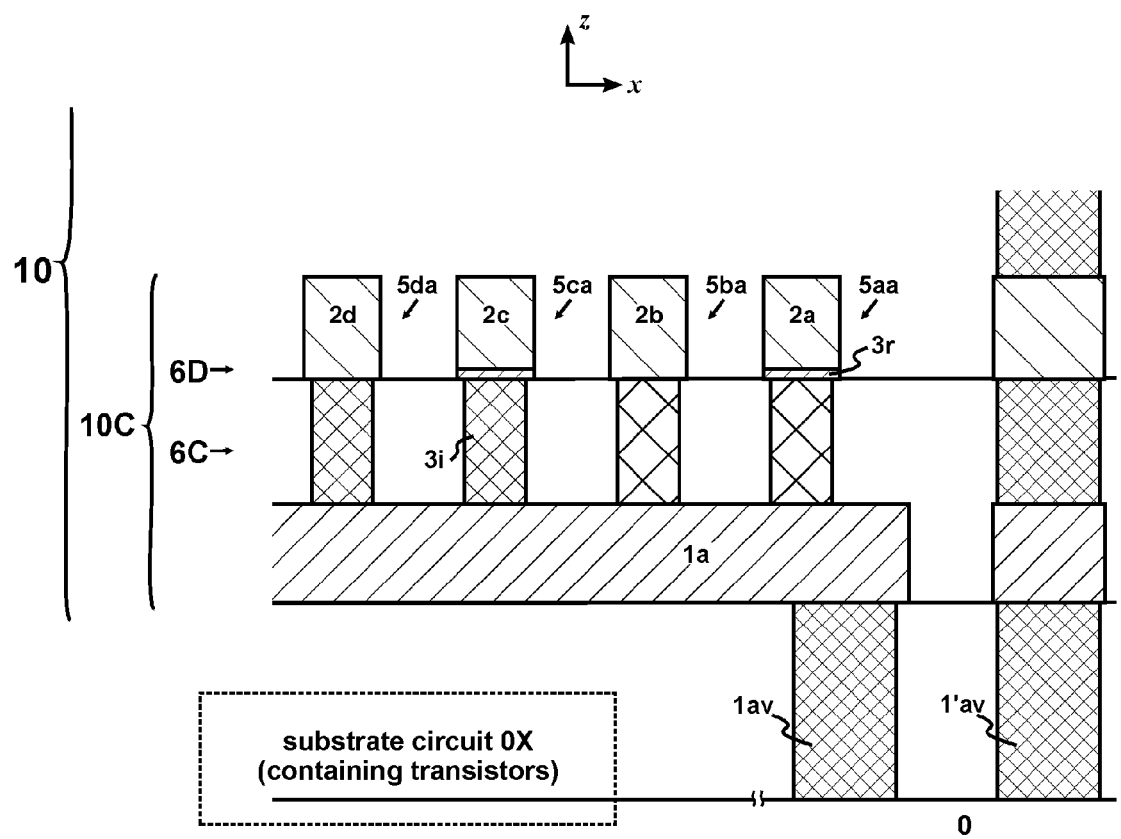
FIG. 3 is a cross-sectional view of a x1x2 3D-MPROM along the cut-line BB' of FIGS. 4A-4B.
Figure 4A:
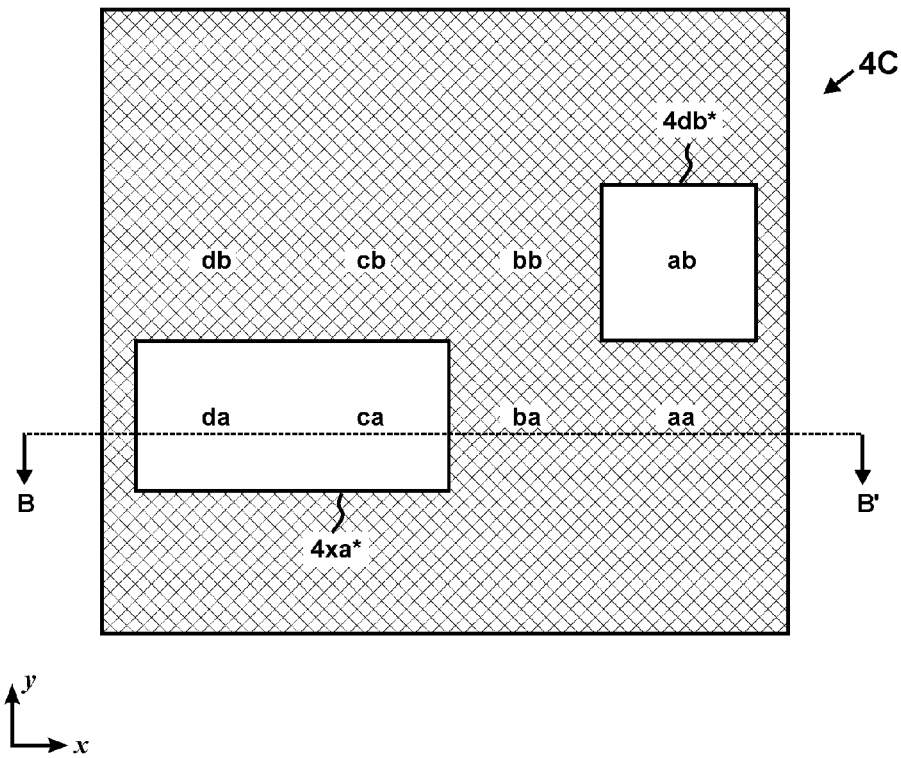
FIGS. 4A-4B disclose two data-masks for the x1x2 3D-MPROM in prior arts.
Figure 4B:
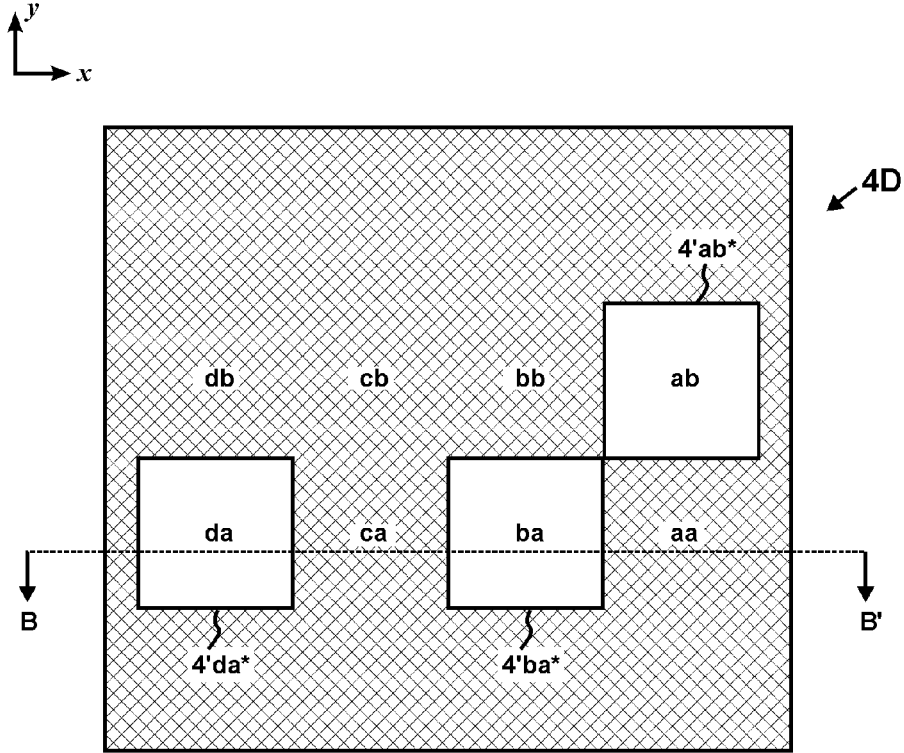

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

In order to reduce the total number of data-masks, the present invention discloses a three-dimensional offset-printed memory (3D-oP). It records data with an offset-printing means. Offset-printing is a printing means. Major printing means includes photo-lithography and imprint-lithography (referring to the co-pending U.S. Patent Application 61/529,919, "Three-Dimensional Printed Memory"): photo-lithography uses data-masks to print data, whereas imprint-lithography uses data-templates (also referred to as master, stamp, or mold) to print data.

Figure 5A:
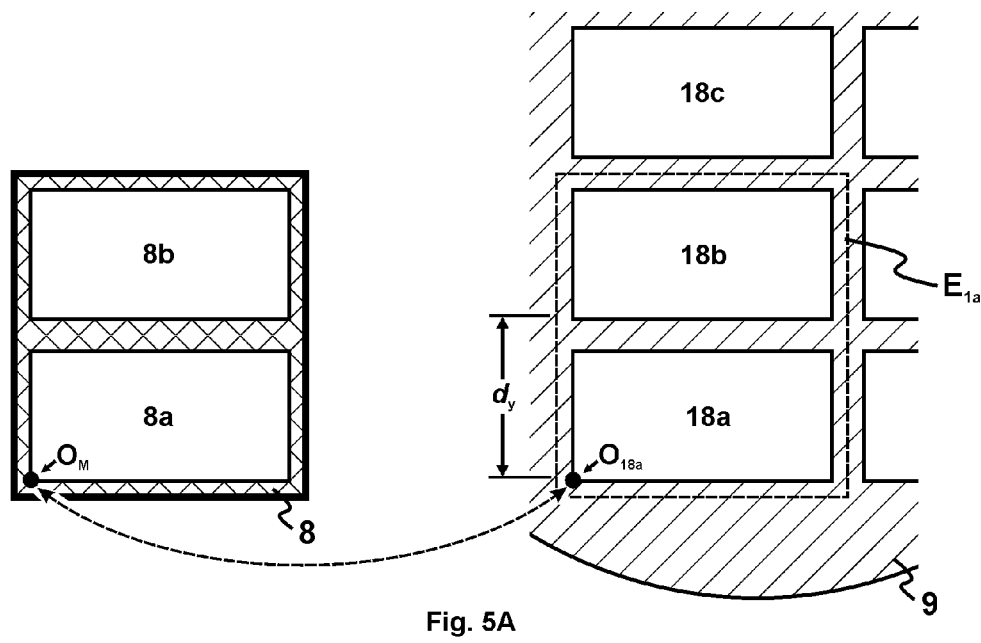
FIGS. 5A-5B illustrate the printing steps used in a preferred offset-printing means.
Figure 5B:
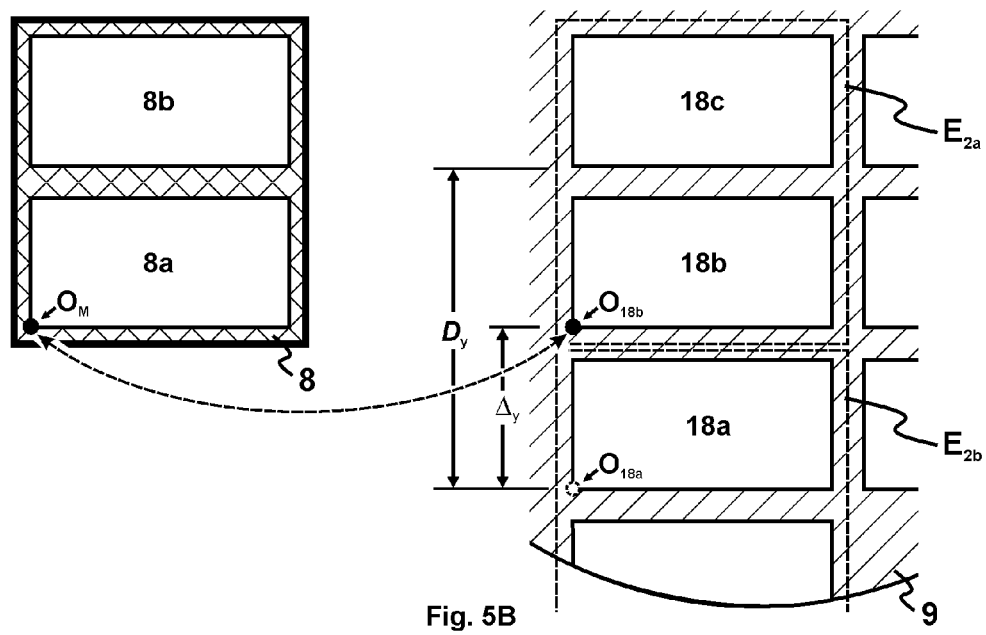

Referring now to FIGS. 5A-5B, an overview of the offset-printing means is disclosed. It uses a multi-region data-mask 8. In this example, this multi-region data-mask 8 comprises the mask-patterns for two different memory levels 16A, 16B. They are located in the data-mask regions 8a, 8b, respectively.

The preferred offset-printing means comprises two printing steps. At the $1^{st}$ printing step (FIG. 5A, i.e. lithography A to code the first memory level 16A), the origin $O_{18a}$ of the die 18a is initially aligned to the origin $O_M$ of the data-mask region 8a. During exposure $E_{1a}$, the data-mask regions 8a is printed to the data-coding layer 6A for the memory level 16A of the dice 18a, while the data-mask regions 8b is printed to the data-coding layer 6A for the memory level 16A of the dice 18b.

At the $2^{nd}$ printing step (FIG. 5B, i.e. lithography B to code the second memory level 16B), the alignment position of the wafer 9 is offset by a value of $\Delta_y$ from its alignment position at the $1^{st}$ printing step. Let $d_y$ be the displacement between the dice 18a and 18b. If $\Delta_y=d_y$, the origin $O_{18b}$ of the die 18b is initially aligned to origin $O_M$. During exposure $E_{2a}$, the data-mask region 8a is printed to the data-coding layer 6B for the memory level 16B of the die 18b.

During the next exposure $E_{2b}$, as long as the stepping distance $D_y$ is twice the displacement $d_y$ between adjacent dice, the data-mask region 8b will be printed to the data-coding layer 6B for the memory level 16B of the die 18a. Finally, on the finished wafer 9, in the die 18a, the data-mask regions 8a, 8b are printed to the data-coding layers 6A, 6B for the memory levels 16A, 16B, respectively; while in the die 18b, they are printed to the data-coding layers 6B, 6A for the memory levels 16B, 16A, respectively.

Figure 6:
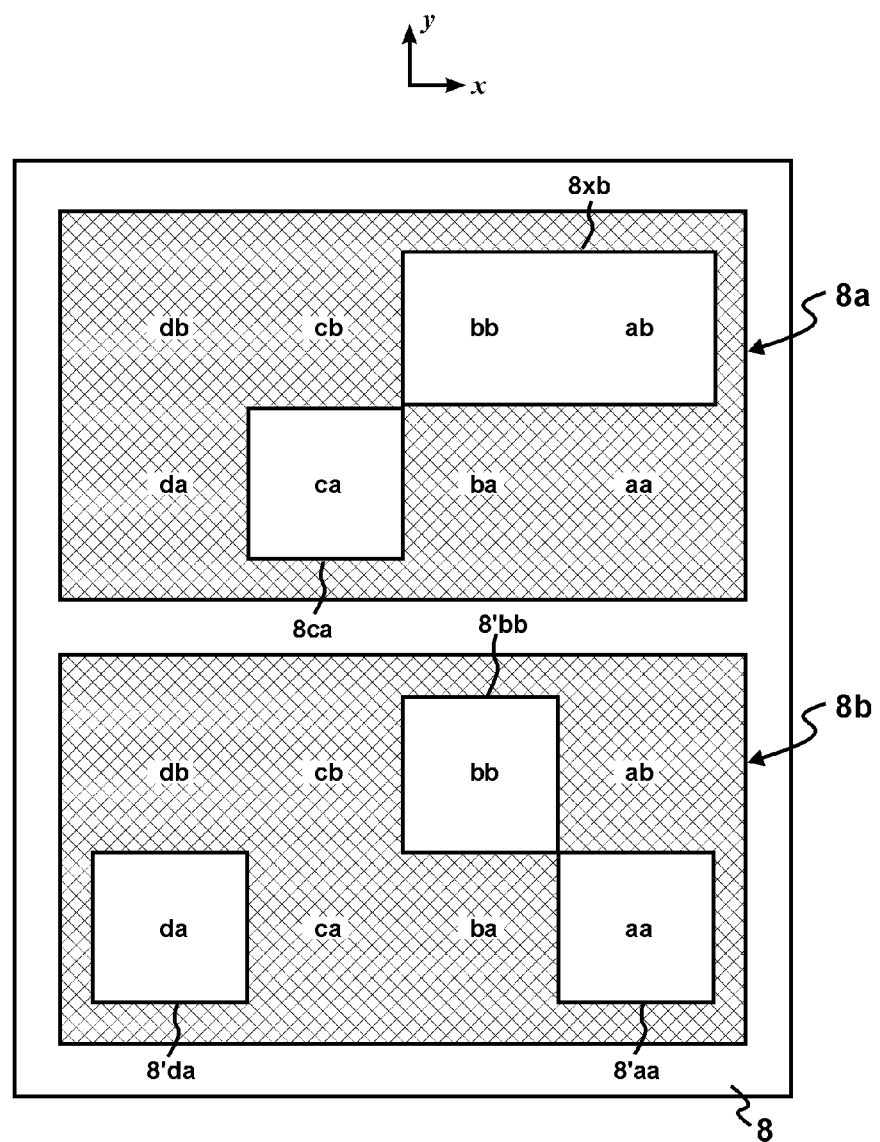
FIG. 6 discloses an exemplary multi-region data-mask.

FIG. 6 discloses more details on an exemplary multi-region data-mask 8. Each of its data-mask regions 8a, 8b is comprised of an array of mask cells "aa"-"bd". In the data-mask region 8a, the clear mask-patterns at the mask cells "ca", "bb", "ab" form mask-openings 8ca, 8xb. In the data-mask region 8b, the clear mask-patterns at the mask cells "aa", "da", "bb" form mask-openings 8aa, 8da, 8bb. If the following convention is used: the dark mask-pattern represents '0' and the clear mask-pattern represents '1', the digital values represented by each mask cell in the data-mask region 8a form a data-array m(1) (FIG. 7A), while the digital values represented by each mask cell in the data-mask region 8b form a data-array m(2) (FIG. 7B).

Figure 8A:
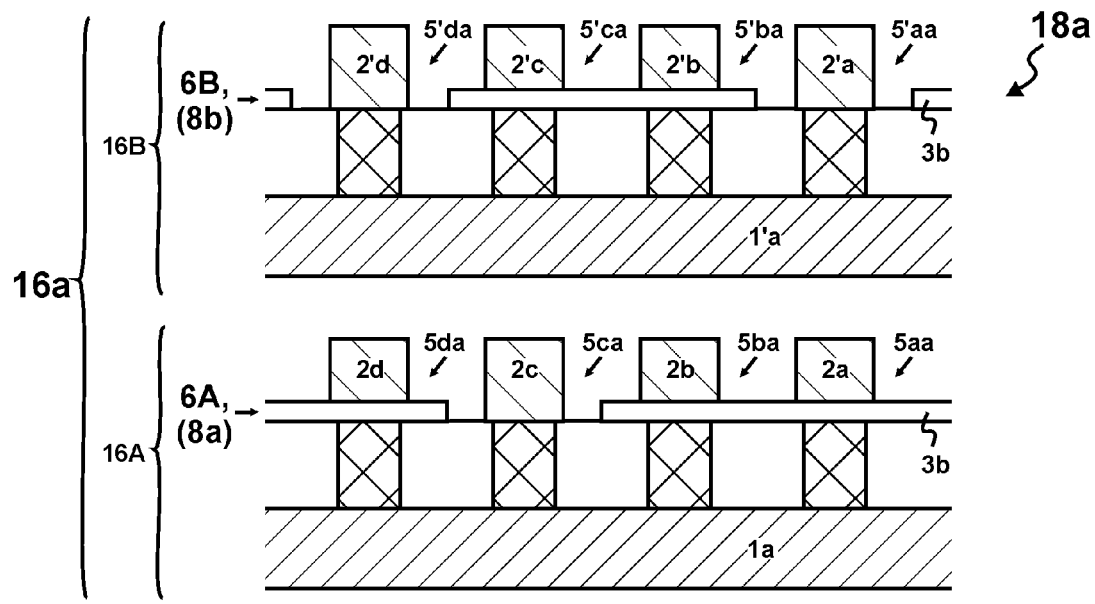
FIGS. 8A-8B are the cross-sectional views of two 3D-oP dice 18a, 18b from a preferred x2x1 3D-oP batch.
Figure 8B:
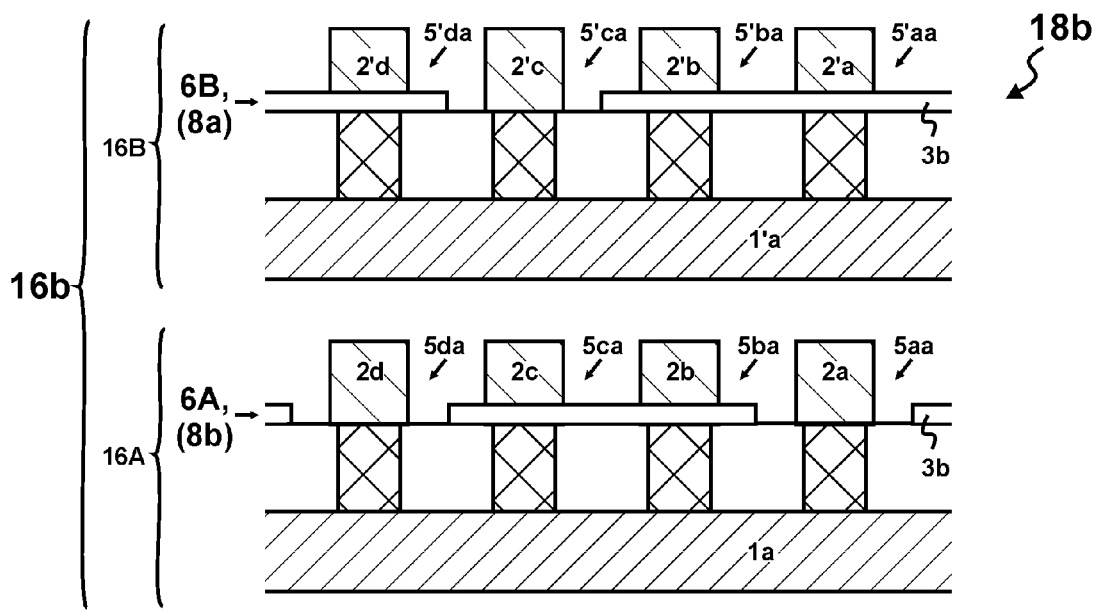

Referring now to FIGS. 8A-8B, two dice 18a, 18b from a preferred x2x1 3D-oP batch are disclosed. In a 3D-oP batch, all dice are manufactured with the same mask set, and all dice have the same 3-D frame. Here, a 3-D frame comprises all address lines in the 3-D stack, but no data-coding layer. In this example, the data for both dice 18a and 18b are printed from the same data-mask 8. FIG. 8A discloses the x2x1 3-D stack 16a of the die 18a. The data-coding layer 6A of the memory level 16A is printed from the data-mask region 8a, while the data-coding layer 6B of the memory level 16B is printed from the data-mask region 8b. Here, the following convention is used: absence of a data-opening represents '0' and existence of a data-opening represents '1'. Accordingly, in the 3D-oP die 18a, the digital values stored in all memory cells in the memory level 16A form a data-array $p_{18a}[1]$ of FIG. 9A; the digital values stored in all memory cells in the memory level 16B form a data-array $p_{18a}[2]$ of FIG. 9B. It can observed that the data-array $p_{18a}[1]$ is same as the mask data-array m(1) of FIG. 7A, i.e. $p_{18a}[1]$=m(1); and, the data-array $p_{18a}[2]$ is same as the mask data-array m(2) of FIG. 7B, i.e. $p_{18a}[2]$=m(2).

On the other hand, FIG. 8B discloses the x2x1 3-D stack 16b of the die 18b. The data-coding layer 6A of the memory level 16A is printed from the data-mask region 8b, while the data-coding layer 6B of the memory level 16B is printed from the data-mask region 8a. Similarly, for die 18b, $p_{18b}[1]$=m(2), $p_{18b}[2]$=m(1).

In a 3D-oP batch, an ordered list (e.g. from the one closet to the substrate to the one farthest from the substrate) of all data-arrays (including the arrays for all memory levels and all bits-in-a-cell) in each 3D-oP die forms a data-array sequence S. A collection of these data-arrays forms a data-array set. By definition, the value of a set is only related to its elements, not the order of these elements. For the dice 18a, 18b of FIGS. 8A-8B, their data-array sequence can be expressed as:

{$S_{18a}$}={$p_{18a}[1]$, $p_{18a}[2]$}={m(1), m(2)};
{$S_{18b}$}={$p_{18b}[1]$, $p_{18b}[2]$}={m(2), m(1)};
with {$S_{18a}$}={$S_{18b}$}, but $S_{18a} \neq S_{18b}$.

It can be observed that, the data-array set of the die 18a is same as that of the die 18b, while the data-array sequence of the die 18a is a reverse of that of the die 18b. To access the same data, different memory level needs to be accessed in the die 18b than that in the die 18a.

Figure 10A:
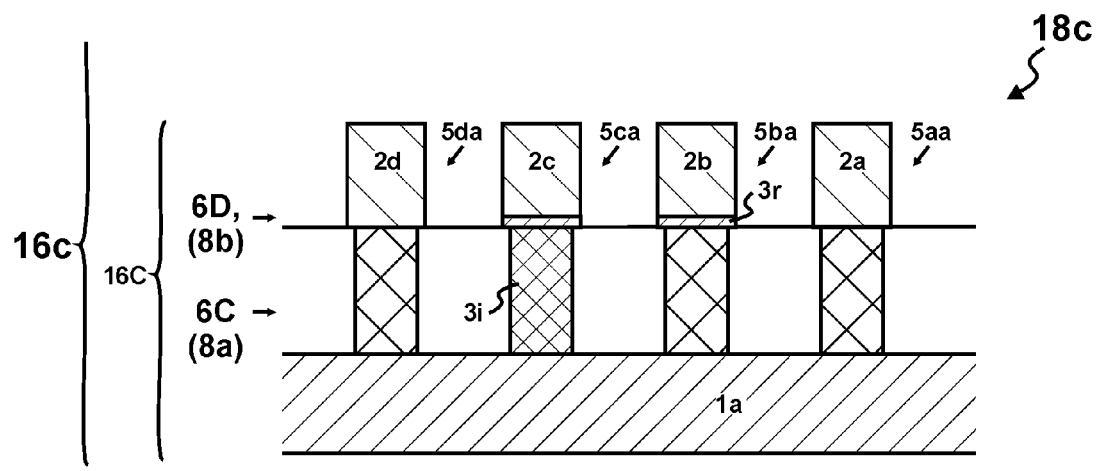
FIGS. 10A-10B are the cross-sectional views of two dice 18c, 18d from a preferred x1x2 3D-oP batch.
Figure 10B:
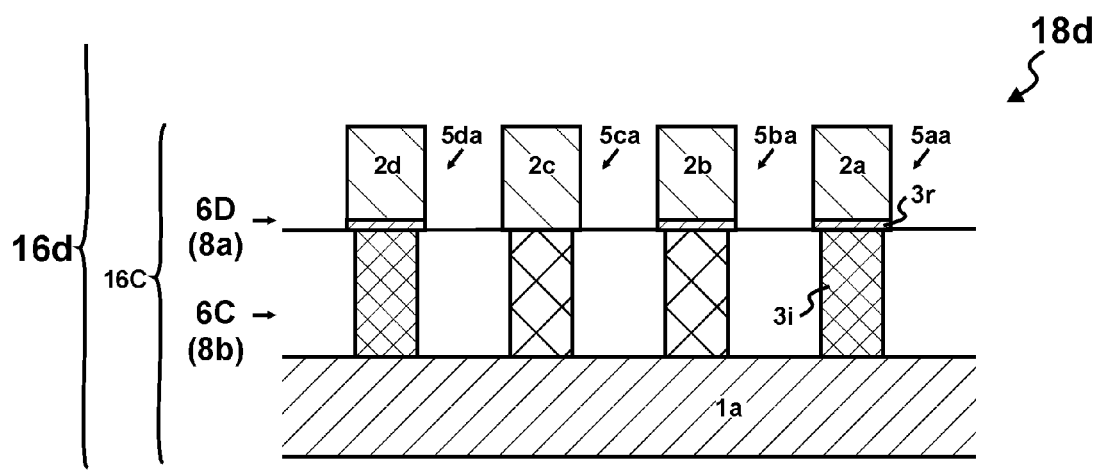

Referring now to FIGS. 10A-10B, offset-printing can also be applied to the 3D-MPROM with n bits-per-cell (bpc). Similarly, the mask-patterns for two different bits-in-a-cell are merged onto a multi-region data-mask. At different printing steps, the wafer is offset by different values with respect to the multi-region data-mask. Accordingly, various data-patterns from the same data-mask are printed into data-coding layers for different bits-in-a-cell. Two x1x2 3D-oP dice 18c, 18d from a preferred 3D-oP batch are illustrated in FIG. 10A-10B.

FIG. 10A discloses an x1x2 3-D stack 16c of die 18c. Each memory cell (e.g. 5aa) in the memory level 16A stores two bits: Bit-1 and Bit-2. Bit-1 is represented by a first data-coding layer 6C, i.e. an extra-implanted layer 3i; Bit-2 is represented by a second data-coding layer 6D, i.e. a resistive layer 3r. The data-coding layer 6C of Bit-1 is printed from the data-mask region 8a, while the data-coding layer 6D of Bit-2 is printed from the data-mask region 8b. Here, the following convention is used: existence of an extra implant represents '0' and absence of an extra implant represents '1'; existence of the resistive layer represents '0' and absence of the resistive layer represents '1'. Accordingly, in the first memory level 16C of the 3D-oP die 18c, the digital values stored by Bit-1 form the data-array $p_{18c}[1,1]$ of FIG. 11A; the digital values stored by Bit-2 form the data-array $p_{18c}[1,2]$ of FIG. 11B. Here, p[i,j] means the data-array for jth-bit-in-a-cell on the 1$^{st}$ memory level of the die 18c. It can be observed that, the data-array $p_{18c}[1,1]$ is opposite to the data-array m(1) of FIG. 7A, i.e. $p_{18c}[1,1]$=−m(1); the data-array $ph_{18c}[1,2]$ is equal to the data-array m(2) of FIG. 7B, i.e. $p_{18c}[1,2]$=−m(2). Here, the symbol "−" means '0', '1' are interchanged. Because the digital values in a data-array could change with definition, the polarity of the data-array has little meaning. In the present invention, two data-arrays are considered same if each bit in the first data-array and its corresponding bit in the second data-array have the same or opposite values.

On the other hand, FIG. 10B discloses an x1x2 3-D stack 16d of die 18d. In the first memory level 16C of the die 18d, the data-coding layer 6C for Bit-1 is printed from the data-mask region 8b, while the data-coding layer 6D for Bit-2 is printed from the data-mask region 8a. Accordingly, for the die 18d, $p_{18d}[1,1]$=−m(2), $p_{18d}[1,2]$=m(1).

For the dice 18c and 18d of FIGS. 10A-10B, their data-array sequences can be expressed as:

$S_{18c}$=($p_{18c}[1,1]$, $p_{18c}[1,2]$)=(−m(1), m(2));
$S_{18d}$=($p_{18d}[1,1]$, $p_{18d}[1,2]$)=(−m(2), m(1));
with {$S_{18c}$}={$S_{18d}$}, but $S_{18c} \neq S_{18d}$.

It can be observed that, the data-array set of the die 18c is same as that of the die 18d, while the data-array sequence of the die 18c is a reverse of that of the die 18d. For the same input address, the bit-order of the output needs to be reversed.

Figure 12:
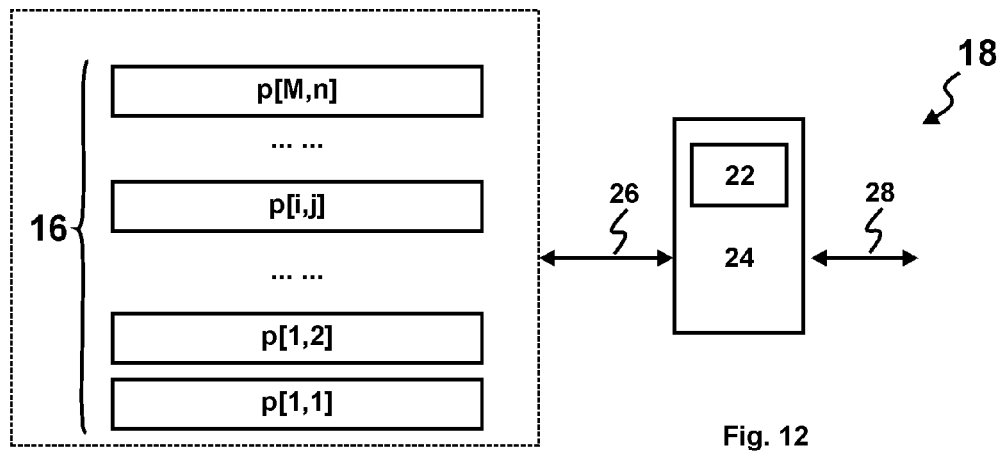
FIG. 12 is a circuit block diagram of a preferred 3D-oP.

FIG. 12 is a circuit block diagram of a preferred 3D-oP 18. It comprises an xMxn 3-D stack 16 and a configurable-I/O means 24. The 3-D stack 16 comprises M×n data-arrays. Here, the data-array for the j-th bit-in-a-cell in the i-th memory level is denoted by p[i,j] (1≤i≤M, 1≤j≤n). The configurable-I/O means 24 comprises a sequence-memory 22, which stores the information related to the data-array sequence of this 3D-oP die. One example of the sequence-related information is chip ID. Chip ID is directly related to the location of the die on a wafer and can be used to extract the information related to its data-array sequence. The sequence-memory 22 is preferably an embedded non-volatile writable memory. For example, it may use direct-write memory, laser-programmable fuse and/or electrically-programmable memory. For the direct-write memory, the sequence-related information can be written during manufacturing. For the laser-programmable fuse, the sequence-related information can be written during or after manufacturing. For the electrically-programmable memory, the sequence-related information can be written after manufacturing.

The configurable-I/O means 24, based on the sequence-related information, changes the input of the external I/O 28 and/or the output of the internal I/O 26 in such a way that the external I/O 26 shows no dependence on the data-array sequence. In other words, all 3D-oPs in the same batch, even though they might have different data-array sequence, appear to have the same external I/O 28 for users. More details on the 3D-oP circuit are disclosed in FIGS. 13A-13B.

Figure 13A:
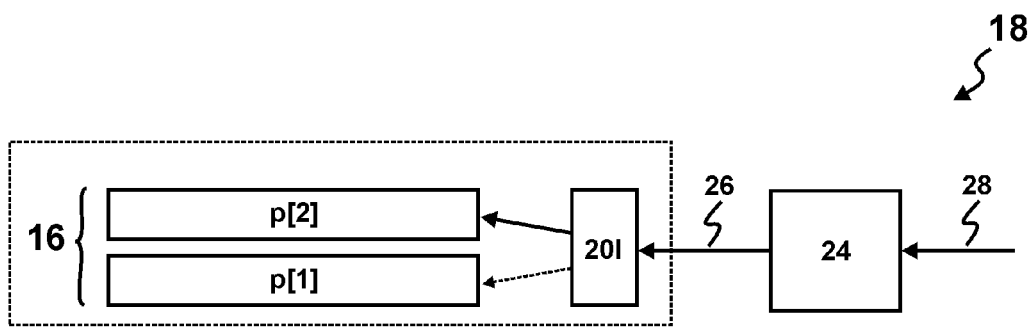
FIG. 13A is a circuit block diagram for the preferred x2x1 3D-oP.

FIG. 13A is a circuit block diagram of the preferred x2x1 3D-oP 18 from FIGS. 8A-8B. The input-address decoder 201 is shown in this figure. The 3-D stack 16 stores two data-arrays p[1], p[2] for the memory levels 16A, 16B, respectively. Here, the notation of data-arrays is simplified to p[i] (1≤i≤M) for the 1-bpc 3D-oP (i.e. each 3D-oP cell stores one bit). The input-address decoder 201 decodes the internal input address 26. For example, if the most significant bit of the internal input address 26 is '0', the data-array p[1] is accessed; otherwise p[2] is accessed. The configurable-I/O means 24 changes the value of the external input address 28 based on the sequence-related information: for the die 18a, the internal input address 26 is same as the external input address 28; for the die 18b, the most significant bit of the internal input address 26 is inverted from that of the external input address 28.

Figure 13B:
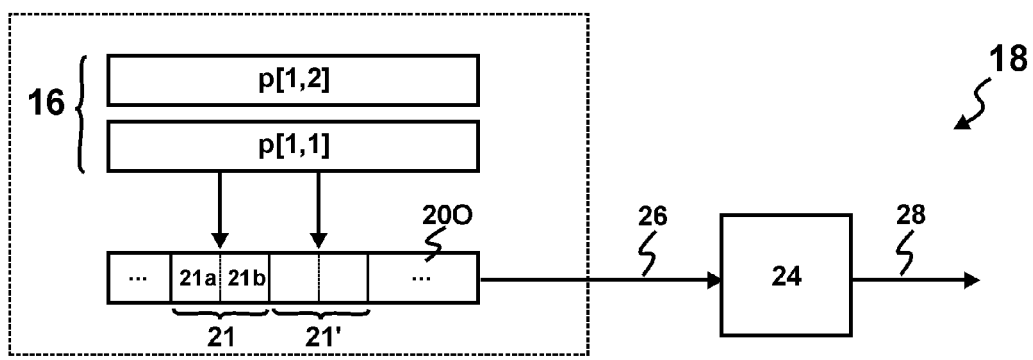
FIG. 13B is a circuit block diagram for the preferred x1x2 3D-oP.

FIG. 13B is a circuit diagram of the preferred x1x2 3D-oP 18 from FIGS. 10A-10B. The output buffer 200 is shown in this figure. The 3-D stack 16 stores two data-arrays p[1,1] and p[1,2] for Bit-1 and Bit-2. The output buffer 200 comprises a plurality of output-groups 21, 21' . . . . Each output-group stores outputs from all bits in a 3D-oP cell. For example, the output-group 21 comprises output-bits 21a, 21b, with the output-bit 21a storing Bit-1 and the output-bit 21 b storing Bit-2, where Bit-1 and Bit-2 are from a same 3D-oP cell. The configurable-I/O means 24 changes the bit-order within each output-group 21 in the output buffer 200 based on the sequence-related information: for the die 18c, the external output 28 is same as the internal output 26; for the die 18d, the bit-order within each output-group (e.g. 21) is reversed.

Figure 14:
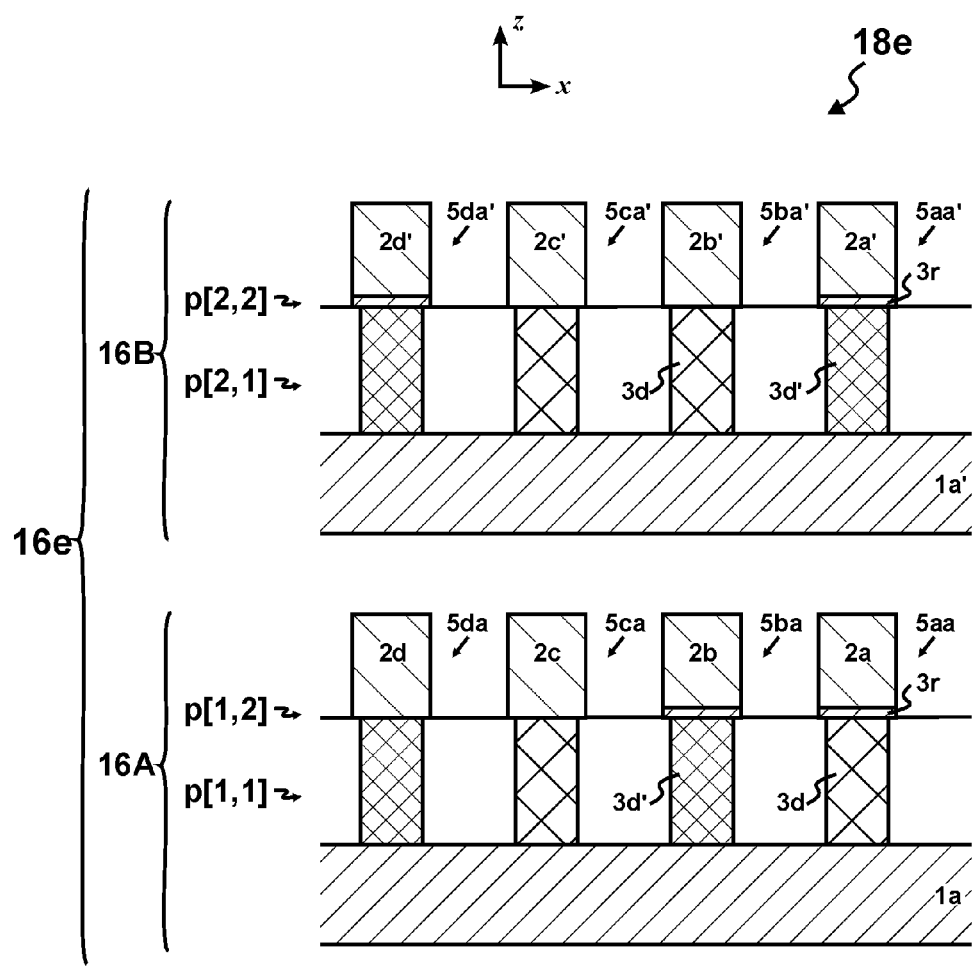
FIG. 14 is a cross-sectional view of a preferred x2x2 3D-oP.

The technique of offset-printing to different memory levels (FIGS. 8A-8B) can be combined with the technique of offset-printing to different bits-in-a-cell (FIGS. 10A-10B). To be more specific, the mask-patterns for different memory levels and different bits-in-a-cell are merged onto a multi-region data-mask. At different printing steps, the wafer is offset by different values with respect to the multi-region data-mask. Accordingly, various data-patterns from the same data-mask are printed into data-coding layers for different memory levels and different bits-in-a-cell. FIG. 14 illustrates an example. This preferred x2x2 3D-oP 18e comprises two memory levels 16A, 16B with 2-bpc: Bit-1, Bit-2. There are a total of four data-coding layers. Their data-arrays are: p[1,1] for Bit-1 in memory level 16A; p[1,2] for Bit-2 in memory level 16A; p[2,1] for Bit-1 in memory level 16B; and p[2,2] for Bit-2 in memory level 16B.

The left side of FIG. 15 illustrates the multi-region data-mask 8 used for the preferred x2x2 3D-oP 18. It comprises four data-mask regions whose mask data-arrays are m(1)-m(4). The origin of the multi-region data-mask is $O_M$. The right side of FIG. 15 illustrates all dice D[1]-D[4] in an exposure field E on a 3D-oP wafer 9. Their origins are $O_1$-$O_4$, respectively. Because these dice D[1]-D[4] are offset-printed with the same data-mask 8, they belong to the same 3D-oP batch.

FIG. 16 is a table listing the data-array for each data-coding layer of each die after each printing step for the preferred 2x2 3D-oP 18. Its third column lists the origin of the die to which $O_M$ is aligned at each printing step. Four printing steps are required for four data-coding layers. At the $1^{st}$ printing step (i.e. for p[1,1]), $O_M$ is aligned to the origin $O_1$ of the die D[1] and the data-arrays p[1,1] of dice D[1]-D[4] are equal to m(1)-m(4), respectively. At the $2^{nd}$ printing step (i.e. for p[1,2]), $O_M$ is aligned to the origin $O_2$ of the die D[2]. As long as the stepping distance $D_y$ along the y direction is twice as much as the die displacement $d_y$ between D[2] and D[1], i.e. $D_y=2d_y$, the data-arrays p[1,2] of dice D[1]-D[4] are equal to m(2), m(1), m(4), m(3), respectively. At the $3^{rd}$ printing step (i.e. for p[2,1]), $O_M$ is aligned to the origin $O_3$ of the die D[3]. As long as the stepping distance D along the x direction is twice as much as the die displacement $d_x$ between D[3] and D[1], i.e. $D_x=2d_x$, the data-arrays p[2,1] of dice D[1]-D[4] are equal to m(3), m(4), m(1), m(2), respectively. At the $4^{th}$ printing step (i.e. for p[2,2]), $O_M$ is aligned to the origin $O_4$ of the die D[4]. As long as $D_y=2d_y$ and $D_x=2d_x$, the data-arrays p[2,2] of dice D[1]-D[4] are equal to m(4), m(3), m(2), m(1), respectively.

In sum, for the dice D[1]-D[4] of FIG. 15, their data-array sequences can be expressed as:

$S_{D[1]}=(p_{D[1]}[1,1], p_{D[1]}[1,2], p_{D[1]}[2,1], p_{D[1]}[2,2])=(m(1), m(2), m(3), m(4))$;

$S_{D[2]}=(p_{D[2]}[1,1], p_{D[2]}[1,2], p_{D[2]}[2,1], p_{D[2]}[2,2])=(m(2), m(1), m(4), m(3))$;

$S_{D[3]}=(p_{D[3]}[1,1], p_{D[3]}[1,2], p_{D[3]}[2,1], p_{D[3]}[2,2])=(m(3), m(4), m(1), m(2))$;

$S_{D[4]}=(p_{D[4]}[1,1], p_{D[4]}[1,2], p_{D[4]}[2,1], p_{D[4]}[2,2])=(m(4), m(3), m(2), m(1))$;

with $\{S_{D[1]}\}=\{S_{D[2]}\}=\{S_{D[3]}\}=\{S_{D[4]}\}$, but $S_{D[1]} \neq S_{D[2]} \neq S_{D[3]} \neq S_{D[4]}$.

From these expressions, it can be observed that all 3D-oP dice D[1]-D[4] have the same data-array set, but can have different data-array sequences.

FIG. 17 is a circuit block diagram of the preferred x2x2 3D-oP 18. The input-address decoder 201 and output buffer 200 are both shown in this figure. They have the same functions are those of FIGS. 13A-13B. The 3-D stack 16 stores four data-arrays p[1,1]-p[2,2]. The configurable-I/O means 24 changes the value of the external input address 28 and/or the internal output 26 based on the sequence-related information: for the die D[1], no change is made; for the die D[2], the bit-order within each output-group (e.g. 21) in the output buffer 200 is reversed; for the die D[3], the most significant bit of the internal input address 26 is inverted from that of the external input address 28; for the die D[4], the most significant bit of the internal input address 26 is inverted from that of the external input address 28, and the bit-order within each output-group (e.g. 21) in the output buffer 200 is reversed.

The technique of offset-printing can not only be applied to the data-coding layers in a single die, but also be applied to the data-coding layers in a group of dice. Accordingly, the present invention discloses a three-dimensional 3D-oP-based memory package ($3D^2$-oP). The $3D^2$-oP package is often released in the form of a memory card. Similarly, the mask-patterns for a plurality of memory levels/bits-in-a-cell of a plurality of dice are merged onto a multi-region data-mask. At different printing steps, the wafer is offset by different values with respect to the data-mask. Accordingly, various data-patterns from the same data-mask are printed into data-coding layers for different memory levels/bits-in-a-cell of different dice in the $3D^2$-oP package.

Figure 18:
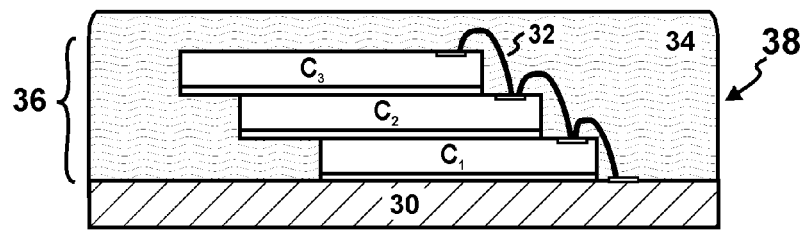
FIG. 18 is a cross-sectional view of a preferred x3x3x1 $3D^2$-oP.

FIG. 18 illustrates a preferred x3x3x1 $3D^2$-oP package 38. Here, xKxMxn $3D^2$-oP package denotes a memory package comprising K vertically stacked xMxn 3D-oP dice. In this example, it comprises three 3D-oP dice $C_1$-$C_3$. They are vertically stacked on an interposer substrate 30 and form a 3D-oP stack 36. Bond wires 32 connect dice $C_1$-$C_3$ to the substrate 30. To improve its data-security, the $3D^2$-oP package 38 is preferably filled with a molding compound 34.

Figure 19:
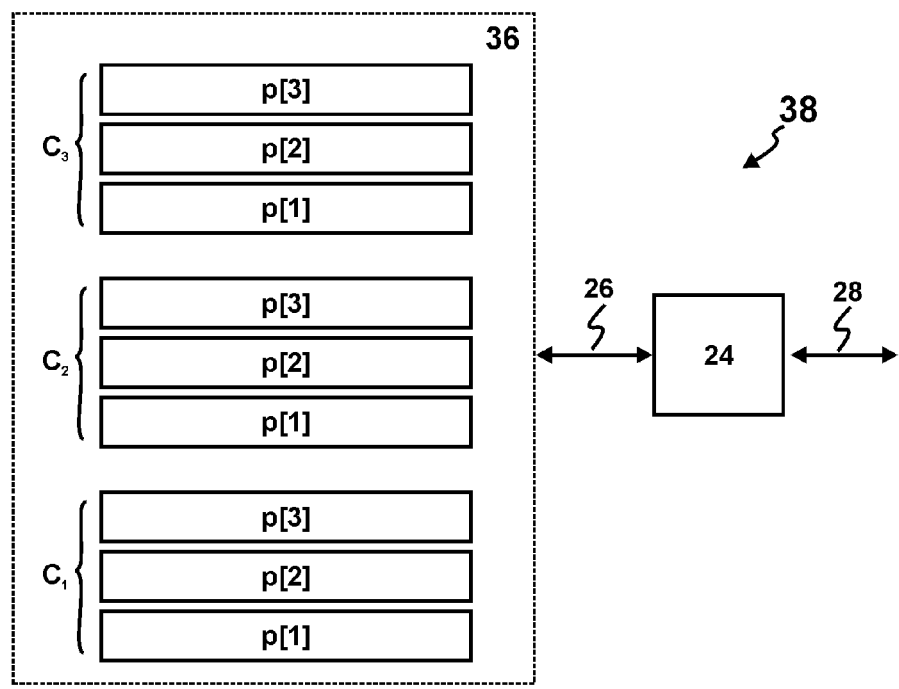
FIG. 19 is a circuit block diagram of the preferred $3D^2$-oP.

FIG. 19 is a circuit block diagram of the preferred $3D^2$-oP package 38. Its 3D-oP stack 36 stores nine data-arrays, i.e. three data-arrays p[1]-p[3] for each of the dice $C_1$-$C_3$. It also comprises a configurable-I/O means 24, which has a similar function as that of FIG. 17. The configurable-I/O means 24 could be located in the 3D-oP die and/or the controller die.

Figures 20, 21, 22:
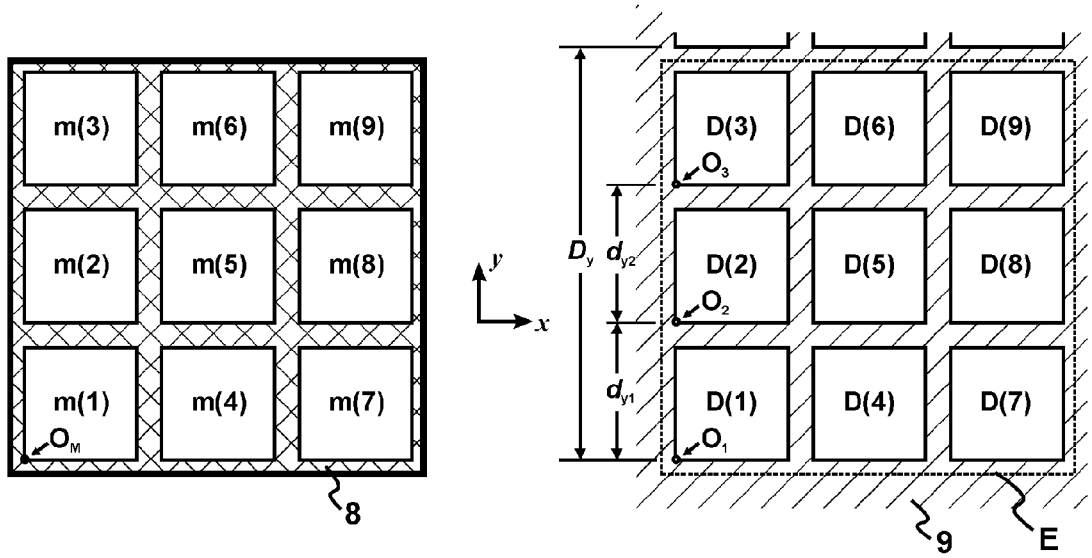
FIG. 20 illustrates a multi-region data-mask for the preferred $3D^2$-oP and all dice in an exposure field.
FIG. 21 is a table listing each data-array in each die after each printing step for the preferred $3D^2$-oP.
FIG. 22 is a table listing three types of packages in a $3D^2$-oP batch.

The left side of FIG. 20 illustrates the multi-region data-mask 8 used for the preferred $3D^2$-oP package 38. It comprises nine data-mask regions whose data-arrays are m(1)-m(9). The origin of the multi-region data-mask 8 is $O_M$. The right side of FIG. 20 illustrates all dice D[1]-D[9] in an exposure field E on a 3D-oP wafer 9. The origins for dice D[1]-D[3] are $O_1$-$O_3$, respectively.

FIG. 21 is a table listing the data-array for each data-coding layer of each dice after each printing step for the preferred $3D^2$-oP package 38. Its third column lists the origin of the die to which $O_M$ is aligned at each printing step.

Three printing steps are required for three data-coding layers. At the $1^{st}$ printing step (i.e. for p[1]), $O_M$ is aligned to the origin $O_1$ of the die D[1] and the data-arrays p[1] of dice D[1]-D[9] are equal to m(1)-m(9), respectively. At the $2^{nd}$ printing step (i.e. for p[2]), $O_M$ is aligned to the origin $O_2$ of the die D[2]. As long as $D_y=3\ d_{y1}=3\ d_{y2}$, the data-arrays p[2] of dice D[1]-D[9] are equal to m(3), m(1), m(2), m(6), m(4), m(5), m(9), m(7), m(8), respectively. At the $3^{rd}$ printing step (i.e. for p[3]), $O_M$ is aligned to the origin $O_3$ of the die D[3]. As long as $D_y=3d_{y1}=3\ d_{y2}$, the data-arrays p[3] of dice D[1]-D[9] are equal to m(2), m(3), m(1), m(5), m(6), m(4), m(8), m(9), m(7), respectively.

FIG. 22 is a table listing three $3D^2$-oP packages M[1]-M[3] formed from nine dice D[1]-D[9] of FIG. 20: the $3D^2$-oP package M[1] comprises dice D[1], D[4], D[7]; the $3D^2$-oP package M[2] comprises dice D[2], D[5], D[8]; and the $3D^2$-oP package M[3] comprises dice D[3], D[6], D[9]. Because these packages M[1]-M[3] are offset-printed with the same data-mask 8, they belong to the same $3D^2$-oP batch.

In sum, for the $3D^2$-oP packages M[1]-M[3] of FIG. 20, their data-array sequences can be expressed as:

$S_{M[1]}=(S_{D[1]}, S_{D[4]}, S_{D[7]})=$(m(1), m(3), m(2); m(4), m(6), m(5); m(7), m(9), m(8));

$S_{M[2]}=(S_{D[2]}, S_{D[5]}, S_{D[8]})=$(m(2), m(1), m(3); m(5), m(4), m(6); m(8), m(7), m(9));

$S_{M[3]}=(S_{D[3]}, S_{D[6]}, S_{D[9]})=$(m(3), m(1), m(1); m(6), m(5), m(4); m(9), m(8), m(7));

with $\{S_{M[1]}\}=\{S_{M[2]}\}=\{S_{M[3]}\}$, but $S_{M[1]} \neq S_{M[2]} \neq S_{M[3]}$. From these expressions, it can be observed that all $3D^2$-oP packages M[1]-M[3] have the same data-array set, but can have different data-array sequences.

While illustrative embodiments have been shown and described, it would be apparent to those skilled in the art that many more modifications than that have been mentioned above are possible without departing from the inventive concepts set forth therein. For example, besides photo-lithography, offset-printing can be applied to imprint-lithography. The invention, therefore, is not to be limited except in the spirit of the appended claims.

What is claimed is:

1. An offset-printing method for printing at least two data-coding layers in a three-dimensional printed memory with a data-mask, comprising the steps of:
   1) forming a substrate circuit on a semiconductor wafer, wherein said wafer comprises at least two adjacent dice including first and second dice;
   2) forming a first memory level above said substrate circuit, including a first printing step for transferring a first mask pattern to a first data-coding layer in said first memory level, wherein an origin of said data-mask is initially aligned to an origin of said first dice at said first printing step;
   3) forming a second memory level above said first memory level, including a second printing step for transferring a second mask pattern to a second data-coding layer in said second memory level, wherein said origin of said data-mask is initially aligned to an origin of said second dice at said second printing step;
   wherein said first and second mask patterns are located on said data-mask.

2. The method according to claim 1, wherein said data-mask comprises at least first and second mask-regions whose mask patterns are transferred to said first and second data-coding layers.

3. The method according to claim 2, wherein the mask pattern of said first mask-region is transferred to said first data-coding layer in said first dice at said first printing step.

4. The method according to claim 2, wherein the mask pattern of said second mask-region is transferred to said first data-coding layer in said second dice at said first printing step.

5. The method according to claim 2, wherein the mask pattern of said first mask-region is transferred to said second data-coding layer in said second dice at said second printing step.

6. The method according to claim 2, wherein the mask pattern of said second mask-region is transferred to said second data-coding layer in said first dice at said second printing step.

7. The method according to claim 2, wherein said first memory level of said first dice stores a first data-array.

8. The method according to claim 2, wherein said second memory level of said first dice stores a second data-array.

9. The method according to claim 2, wherein said first memory level of said second dice stores a second data-array.

10. The method according to claim 2, wherein said second memory level of said second dice stores a first data-array.

11. The method according to claim 1, wherein said first printing step is photo-lithography.

12. The method according to claim 1, wherein said second printing step is photo-lithography.

13. The method according to claim 1, wherein said first printing step is imprint-lithography.

14. The method according to claim 1, wherein said second printing step is imprint-lithography.

* * * * *